US009919342B2

(12) United States Patent
Bibl et al.

(10) Patent No.: US 9,919,342 B2
(45) Date of Patent: Mar. 20, 2018

(54) PIEZOELECTRIC TRANSDUCERS USING MICRO-DOME ARRAYS

(71) Applicant: FUJIFILM Dimatix, Inc., Lebanon, NH (US)

(72) Inventors: Andreas Bibl, Los Altos, CA (US); Hung-fai Stephen Law, Los Altos, CA (US); Kevin von Essen, San Jose, CA (US); Mats G. Ottosson, Saltsjo-Boo (SE)

(73) Assignee: FUJIFILM Dimatix, Inc., Lebanon, NH (US)

( * ) Notice: Subject to any disclaimer, the term of this patent is extended or adjusted under 35 U.S.C. 154(b) by 9 days.

(21) Appl. No.: 14/753,634

(22) Filed: Jun. 29, 2015

(65) Prior Publication Data

US 2015/0298173 A1    Oct. 22, 2015

Related U.S. Application Data

(63) Continuation of application No. 13/396,230, filed on Feb. 14, 2012, now Pat. No. 9,070,862.
(Continued)

(51) Int. Cl.
*H01L 41/08* (2006.01)
*A61B 8/00* (2006.01)
(Continued)

(52) U.S. Cl.
CPC .......... *B06B 1/0622* (2013.01); *B06B 1/0207* (2013.01); *B06B 1/0644* (2013.01);
(Continued)

(58) Field of Classification Search
CPC ..... H04R 17/00; B06B 1/0622; B06B 1/0207; B06B 1/0644; G10K 11/32; H01L 41/04;
(Continued)

(56) References Cited

U.S. PATENT DOCUMENTS 3,962,063 A    6/1976  Hingorany
3,997,804 A   12/1976  Tamura et al.
(Continued)

FOREIGN PATENT DOCUMENTS

EP    0764992 A1    3/1997
JP    S60167598 A   5/1985
(Continued)

OTHER PUBLICATIONS

Authorized officer Lee W. Young, International Search Report and Written Opinion in PCT/US2011/045057, mailed Dec. 7, 2011, 12 pages.
(Continued)

*Primary Examiner* — Thomas Dougherty
(74) *Attorney, Agent, or Firm* — Fish & Richardson P.C.

(57) ABSTRACT

An ultrasonic piezoelectric transducer device includes a transducer array consisting of an array of vibrating elements, and a base to which the array of vibrating elements in the transducer array are attached. The base include integrated electrical interconnects for carrying driving signals and sensed signals between the vibrating elements and an external control circuit. The base can be an ASIC wafer that includes integrated circuitry for controlling the driving and processing the sensed signals. The interconnects and control circuits in the base fit substantially within an area below the array of multiple vibrating elements.

22 Claims, 6 Drawing Sheets

Related U.S. Application Data

(60) Provisional application No. 61/443,042, filed on Feb. 15, 2011.

(51) Int. Cl.

| | |
|---|---|
| *G10K 11/00* | (2006.01) |
| *H04R 17/00* | (2006.01) |
| *H01L 41/04* | (2006.01) |
| *B06B 1/06* | (2006.01) |
| *G10K 11/32* | (2006.01) |
| *H01L 41/316* | (2013.01) |
| *H01L 41/09* | (2006.01) |
| *B06B 1/02* | (2006.01) |
| *H01L 41/047* | (2006.01) |

(52) U.S. Cl.
CPC .............. *G10K 11/32* (2013.01); *H01L 41/04* (2013.01); *H01L 41/047* (2013.01); *H01L 41/0805* (2013.01); *H01L 41/09* (2013.01); *H01L 41/098* (2013.01); *H01L 41/316* (2013.01)

(58) Field of Classification Search
CPC ... H01L 41/047; H01L 41/0805; H01L 41/09; H01L 41/098
USPC .................................................. 310/311–371
See application file for complete search history.

(56) References Cited

U.S. PATENT DOCUMENTS

| | | | |
|---|---|---|---|
| 4,045,695 A | 8/1977 | Itagaki et al. | |
| 4,088,915 A | 5/1978 | Kodama | |
| 4,322,877 A | 4/1982 | Taylor | |
| 4,523,122 A | 6/1985 | Tone et al. | |
| 4,535,205 A | 8/1985 | Ravinet et al. | |
| 4,700,203 A | 10/1987 | Yamamuro et al. | |
| 5,154,797 A | 10/1992 | Blomquist et al. | |
| 5,265,069 A | 11/1993 | Wardle | |
| 5,340,510 A | 8/1994 | Bowen | |
| 5,557,305 A | 9/1996 | Hine et al. | |
| 5,598,050 A | 1/1997 | Bowen et al. | |
| 5,634,999 A | 6/1997 | Takeuchi et al. | |
| 5,684,519 A | 11/1997 | Matoba et al. | |
| 5,691,960 A | 11/1997 | Gentilman et al. | |
| 5,831,371 A | 11/1998 | Bishop | |
| 5,841,736 A | 11/1998 | Bowen et al. | |
| 5,856,837 A | 1/1999 | Kitahara et al. | |
| 5,870,482 A | 2/1999 | Loeppert et al. | |
| 5,888,412 A | 3/1999 | Sooriakumar et al. | |
| 5,950,291 A | 9/1999 | Gentilman et al. | |
| 6,074,178 A | 6/2000 | Bishop et al. | |
| 6,107,726 A | 8/2000 | Near et al. | |
| 6,111,818 A | 8/2000 | Bowen et al. | |
| 6,126,273 A | 10/2000 | Van Vooren et al. | |
| 6,168,906 B1 | 1/2001 | Bernstein et al. | |
| 6,217,150 B1 | 4/2001 | Heydinger | |
| 6,217,158 B1 | 4/2001 | Kanaya et al. | |
| 6,222,304 B1 | 4/2001 | Bernstein | |
| 6,321,428 B1 | 11/2001 | Toda et al. | |
| 6,361,154 B1 | 3/2002 | Watanabe et al. | |
| 6,492,762 B1 | 12/2002 | Pant et al. | |
| 6,589,180 B2 | 7/2003 | Erikson et al. | |
| 6,824,253 B2 | 11/2004 | Hoisington et al. | |
| 6,937,736 B2 | 8/2005 | Toda | |
| 7,018,015 B2 | 3/2006 | Truninger et al. | |
| 7,183,043 B2 | 2/2007 | Meijer et al. | |
| 7,204,586 B2 | 4/2007 | Hoisington et al. | |
| 7,309,948 B2 | 12/2007 | Kuniyasu et al. | |
| 7,378,030 B2 | 5/2008 | Truninger et al. | |
| 7,502,482 B2 | 3/2009 | Dehe et al. | |
| 7,687,976 B2 | 3/2010 | Haider et al. | |
| 7,749,868 B2 | 7/2010 | Honda et al. | |
| 7,875,941 B2 | 1/2011 | Freidhoff | |
| 7,982,369 B2 | 7/2011 | Ona et al. | |
| 8,767,512 B2 | 7/2014 | Hajati | |
| 9,070,862 B2 * | 6/2015 | Bibl | B06B 1/0644 |
| 2001/0042291 A1 | 11/2001 | Esashi et al. | |
| 2003/0068580 A1 | 4/2003 | Lin | |
| 2003/0176043 A1 | 9/2003 | Kim et al. | |
| 2005/0133479 A1 | 6/2005 | Youngner et al. | |
| 2005/0146401 A1 | 7/2005 | Tilmans et al. | |
| 2005/0277853 A1 | 12/2005 | Mast et al. | |
| 2006/0147329 A1 | 7/2006 | Tanner | |
| 2006/0152554 A1 | 7/2006 | Hoisington et al. | |
| 2006/0214542 A1 | 9/2006 | Iwashita et al. | |
| 2006/0227179 A1 | 10/2006 | Temple et al. | |
| 2006/0286829 A1 | 12/2006 | Kim et al. | |
| 2007/0000864 A1 | 1/2007 | Abe et al. | |
| 2007/0026632 A1 | 2/2007 | Yamamoto | |
| 2007/0276238 A1 * | 11/2007 | Sudol | B06B 1/0633 600/437 |
| 2008/0020573 A1 | 1/2008 | Birkmeyer et al. | |
| 2008/0284543 A1 | 11/2008 | Taniguchi et al. | |
| 2009/0116675 A1 | 5/2009 | Miyoshi | |
| 2009/0155728 A1 | 6/2009 | Locascio et al. | |
| 2009/0204004 A1 | 8/2009 | Adachi et al. | |
| 2010/0025785 A1 | 2/2010 | Robinson et al. | |
| 2010/0167433 A1 | 7/2010 | Lee et al. | |
| 2010/0301703 A1 | 12/2010 | Chen et al. | |
| 2011/0037812 A1 | 2/2011 | Naono et al. | |
| 2012/0167823 A1 * | 7/2012 | Gardner | C23C 14/08 118/695 |
| 2012/0206014 A1 | 8/2012 | Bibl et al. | |
| 2012/0248063 A1 | 10/2012 | Brabander et al. | |
| 2012/0252221 A1 | 10/2012 | Brabander et al. | |
| 2012/0262029 A1 * | 10/2012 | De Brabander | B41J 2/14209 310/328 |
| 2013/0210175 A1 * | 8/2013 | Hoisington | B41J 2/14233 438/21 |
| 2013/0289593 A1 | 10/2013 | Hall et al. | |
| 2013/0293065 A1 | 11/2013 | Hajati et al. | |
| 2014/0117812 A1 | 5/2014 | Hajati | |
| 2015/0158052 A1 * | 6/2015 | Latev | B06B 1/0622 310/316.01 |
| 2016/0013394 A1 | 1/2016 | Savoia et al. | |

FOREIGN PATENT DOCUMENTS

| | | |
|---|---|---|
| JP | H1075953 A | 3/1998 |
| JP | H1081016 A | 3/1998 |
| JP | 2000-307163 | 11/2000 |
| JP | 2005118394 A | 5/2005 |
| JP | 2007-335779 | 12/2007 |
| JP | 2009207882 A | 9/2009 |
| WO | WO 01/73861 A1 | 10/2001 |
| WO | WO2006009941 A2 | 1/2006 |
| WO | 2012/018561 | 2/2012 |
| WO | 2012/112540 | 8/2012 |

OTHER PUBLICATIONS

Authorized Officer S. G. Bac, International Search Report and Written Opinion in PCT/US2012/025035, dated Oct. 10, 2012, 9 pages.

Franssila, *Introduction to Microfabrication*, 2010, p. 198: in Google Books, 2011, [retrieved on Nov. 4, 2011].

Peake et al., "A Micromachined, Shadow-Mask Technology for the OMVPE Fabrication of Integrated Optical Structures," *J Electronic Materials*, 2000, 29(1):86-90.

'BYU' [online]. "KOH Etching," 1990, [retrieved on Dec. 16, 2012]. Retrieved from http://cleanroom.byu.edu.KOH.phtml, 1 page.

Notification of Grounds for Rejection, Japanese Application No. 2013-554545, Nov. 24, 2015, 8 pages.

Supplementary European Search Report, European Application No. 12746454.3, dated Oct. 23, 2017, 4 pages.

(56) References Cited

OTHER PUBLICATIONS

Communication Pursuant to Article 94(3) EPC, European Application No. 12746454.3, dated Nov. 20, 2017, 7 pages.

* cited by examiner

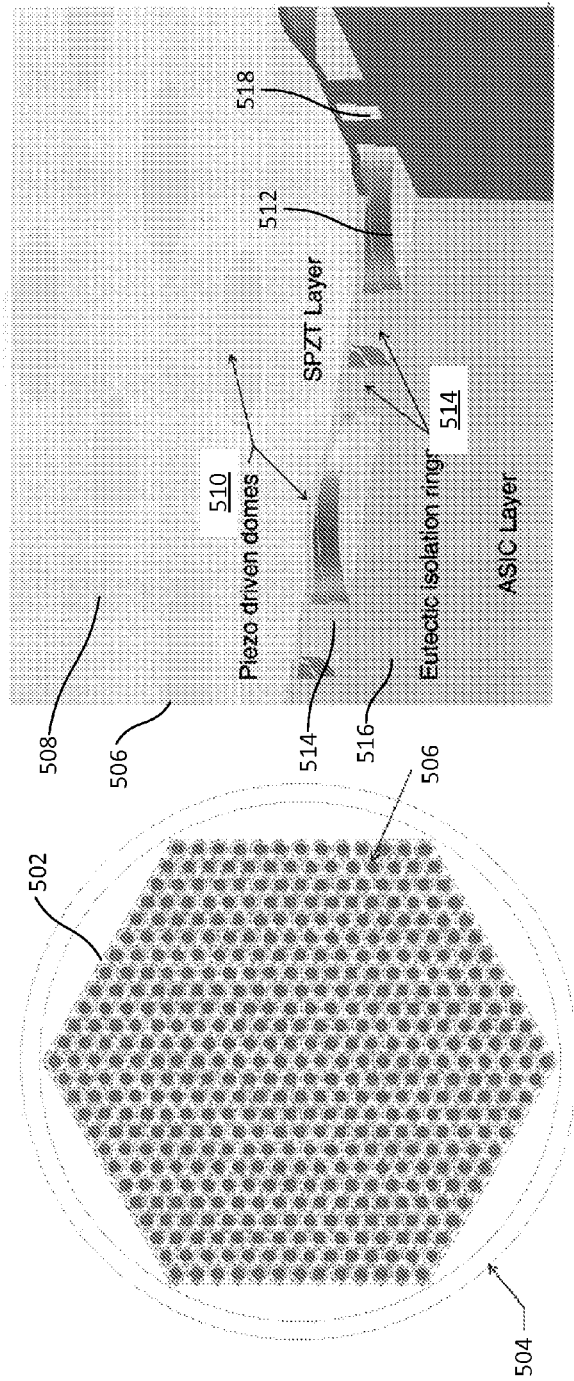
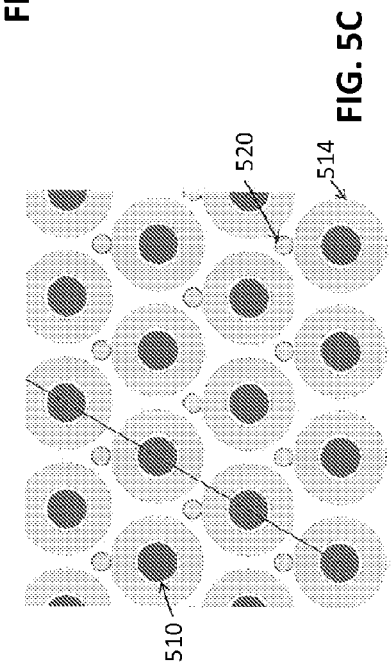
FIG. 5A
FIG. 5B
FIG. 5C

PIEZOELECTRIC TRANSDUCERS USING MICRO-DOME ARRAYS

CLAIM OF PRIORITY

This application is a continuation of U.S. patent application Ser. No. 13/396,230, filed Feb. 14, 2012, which claims priority to U.S. Patent Application Ser. No. 61/443,042, filed on Feb. 15, 2011, the entire contents of which are hereby incorporated by reference.

TECHNICAL FIELD

This specification relates to piezoelectric transducers.

BACKGROUND

A piezoelectric transducer includes a piezoelectric element capable of converting electrical energy into mechanical energy (e.g., sound or ultrasound energy), and vice versa. Thus, a piezoelectric transducer can serve both as a transmitter of mechanical energy and a sensor of impinging mechanical energy.

An ultrasonic piezoelectric transducer device can include a piezoelectric vibrating element that vibrates at a high frequency in response to a time-varying driving voltage, and generates a high frequency pressure wave in a propagation medium (e.g., air, water, or tissue) in contact with an exposed outer surface of the vibrating element. This high frequency pressure wave can propagate into other media. The same vibrating element can also receive reflected pressure waves from the propagation media, and converts the received pressure waves into electrical signals. The electrical signals can be processed in conjunction with the driving voltage signals to obtain information on variations of density or elastic modulus in the propagation media.

An ultrasonic piezoelectric transducer device can include an array of piezoelectric vibrating elements, each vibrating element can be individually controlled with a respective driving voltage and time delay, such that a pressure wave having a desired direction, shape, and focus can be created in the propagation medium by the array of vibrating elements collectively, and information on the variations of density or elastic modulus in the propagation media can be more accurately and precisely ascertained based on the reflected and/or refracted pressure waves captured by the array of piezoelectric vibrating elements.

Conventionally, many ultrasonic transducer devices use vibrating elements formed from mechanically dicing a bulk piezoelectric material or by injection molding a carrier material infused with piezoelectric ceramic crystals.

SUMMARY

This specification describes technologies related to piezoelectric transducers.

A piezoelectric transducer device can include one or more vibrating elements each having an inner surface suspended above and attached to a base, and an outer surface exposed to a propagation medium. The one or more vibrating elements can vibrate in response to an applied time-varying driving voltage and generate a pressure wave in the propagation medium in contact with the exposed outer surface of the vibrating elements.

Each vibrating element can include a piezoelectric element disposed between a drive electrode and a reference electrode. The electrode that is farther away from the base is the outward-facing electrode of the vibrating element. The drive electrode, reference electrode, and the piezoelectric element each have a respective flexible portion and a respective stationary portion adjoining (e.g., surrounding) the flexible portion, and where the respective flexible portions of the drive electrode, reference electrode, and piezoelectric element (in other words, the flexible portion of the entire vibrating element) are curved concavely or convexly relative to the base, in the absence of an applied voltage on the vibrating element. Alternatively, the vibrating element can be flat. The exposed outer surface of each vibrating element can include the outer surface of the outward-facing electrode of the vibrating element, or alternatively, the outer surface of a flexible protective coating covering the outward-facing electrode of the vibrating element.

In the transducer device, the same one or more vibrating elements can also serve as sensing elements that, in response to varying mechanical pressures exerted by reflected pressure waves in the propagation medium, can generate a sensed voltage across the piezoelectric element between the pair of electrodes. The transducer device can alternate between driving and sensing modes according to a timed switch.

In various implementations, the piezoelectric transducer device can include a transducer array consisting of an array of vibrating elements, and a base to which the array of vibrating elements in the transducer array are attached. In some implementations, the base can include a plurality of integrated electrical interconnects for carrying driving signals and sensed signals between the vibrating elements of the transducer array and an external control circuit. In some implementations, the base can be an ASIC wafer that includes integrated circuitry for sending the driving voltage signals to and registering the sensed voltage signals from the array of vibrating elements. The ASIC wafer can fit substantially within an area below the array of multiple vibrating elements. The array of vibrating elements in the transducer array can share a common reference electrode on one side, and have a respective individually controllable drive electrode on the opposite side. The common reference electrode and the individually controllable drive electrodes of the vibrating elements can be electrically connected to the integrated circuitry in the ASIC wafer. A vertically-oriented interconnect can be formed between the drive electrode of each vibrating element and the control circuitry in the ASIC wafer. The vertically-oriented interconnects can enable a large number of connections to be accommodated within a small lateral area occupied by the array of vibrating elements.

In various implementations, the piezoelectric transducer device (including the piezoelectric elements, drive electrodes, common reference electrode of the array of vibrating elements (e.g., the curved or flat piezoelectric vibrating elements), and the electrical connections made to the integrated circuitry in the ASIC wafer) can be fabricated using various semiconductor processing techniques (e.g., material deposition, lithographic patterning, feature formation by etching, etc.).

Particular implementations of the subject matter described in this specification can be implemented so as to realize one or more of the following advantages.

In some implementations, the array of vibrating elements in a piezoelectric transducer device can be created using semiconductor fabrication processes, and the dimensions and pitch of the vibrating elements in the array can be made much smaller and controlled more precisely than those achievable in vibrating elements formed by mechanically dicing a bulk piezoelectric material or by injecting molding. The smaller vibrating elements and the finer pitch between adjacent vibrating elements can enable higher imaging resolution based on the reflected and refracted pressure waves received by the vibrating elements. Furthermore, multiple transducer devices can be fabricated on the same wafer using the semiconductor fabrication processes, reducing the cost for individual transducer devices.

In various implementations, control circuitry and sensing circuitry for the piezoelectric transducer device can be implemented in an AISC layer in the base attached to the underside of the array of curved vibrating elements. Since an ASIC layer can support a large number of internal output connections using a small number of external input connections, the transducer device including an integrated AISC layer for providing the driving signals can have a smaller number of external input wires, e.g., the wire bundle to be connected to the transducer device can be thinner. By reducing the lateral area needed to accommodate the external input connections for the transducer device, and the overall size of the transducer device can be reduced, which can permit the device to be used in smaller spaces and thus in a wider variety of applications. Furthermore, much processing logic for controlling the direction, focus, shape, and/or frequency of the transmitted pressure waves can be implemented in the AISC layer, reducing the total cost of the peripheral supporting equipment (e.g., external driving circuits and connection cables) of the piezoelectric transducer. In some implementations, the reduction in device size can be achieved with a base having integrated electrical interconnects that connects to an external control circuits or a control circuit situated at a convenient location not directly below the transducer array.

In addition, for a given applied voltage, a curved piezoelectric element (e.g., a piezoelectric film have a domed portion surrounded by a planar portion) has a larger displacement (e.g., 5-10 times larger) than a flat piezoelectric membrane or a piezoelectric body (e.g., rod) of a comparable size. Therefore, by using a curved piezoelectric element in each vibrating element of the piezoelectric transducer device, stronger pressure waves can be generated using a given driving voltage. Similarly, for a given acceptable sensed voltage level, a lower mechanical pressure is required. For example, a driving voltage of 10-20 volts or less can be required for an ultrasonic transducer device made of a micro-dome transducer array, as compared to 100-200 volts required for ultrasonic transducer device formed from diced bulk piezoelectric materials. With a lower required driving voltage, power consumption and loss due to ohmic heating can be reduced, and excessive temperatures on the transducer device due to ohmic heating can be also avoided. This can also permit the device to be used in a wider variety of applications.

In addition, due to the small sizes of the vibrating elements that can be achieved using semiconductor processing techniques, the compact size of the ASIC layer, and the low driving voltages required for driving the vibrating elements, piezoelectric transducer devices suitable for high-precision medical diagnostic and therapeutic applications can be developed using the designs disclosed in this specification. For example, the low voltage, low heat, small size of the transducer devices can make it safer and/or more comfortable for usage in contact with a patient's skin or inside a patient's body. In addition, dynamic imaging of small, delicate, and hard-to-access areas in a patient's body (e.g., eyes, blood vessels, or brain) can be enabled by the transducer designs disclosed in this specification. Also, providing an ASIC layer with an array of driving circuitry that corresponds to an array of vibrating elements with vertical connections to the vibrating elements can enable the vibrating elements to closely packed, which can improve image quality. In addition, the resonance frequencies and impedance of the curved vibrating elements can be controlled in the design and manufacturing process of the piezoelectric transducer, for example, by varying the size, shape, and thickness of the curved piezoelectric elements. Therefore, applications that require different operating frequency ranges, and different types of propagation media (e.g., different impedances) can all be accommodated.

In some implementations, the curved piezoelectric element can be formed by depositing particles of a piezoelectric material (e.g., sputtering) on a curved profile-transferring substrate. Alternatively, the sputtered piezoelectric material can form a flat piezoelectric element. The curved or flat piezoelectric element formed by deposition has columnar grain structures that are aligned and perpendicularly oriented relative to the curved or flat surfaces of the piezoelectric element and a natural as-deposited poling direction pointing in the direction of the columnar grains. Such aligned columnar grain structure poses less internal stress during operation, leading to longer lifetime of a piezoelectric transducer formed for such piezoelectric elements.

In some implementations, the peripheral portion of the curved portion of each piezoelectric element is kept stationary during operation, while a central portion of the curved portion flexes in response to the driving voltages. By placing the transition point between the flexing portion and the stationary portion of the piezoelectric element in an area of the piezoelectric element where the grain structures are more aligned, the piezoelectric element can better withstand the high stress occurring at the transition point, which can lead to longer lifetime of the piezoelectric element and the piezoelectric transducer device.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 5A is a schematic top view of an example micro-dome transducer array in a piezoelectric transducer device.

FIG. 5B is a perspective view of a portion of the micro-dome transducer array in the piezoelectric transducer device shown in FIG. 5A.

FIG. 5C is a close-up top view of the micro-dome transducer array shown in FIG. 5A.

Many of the layers and features are exaggerated to better show the process steps and results. Like reference numbers and designations in the various drawings indicate like elements.

DETAILED DESCRIPTION

Figure 1A:
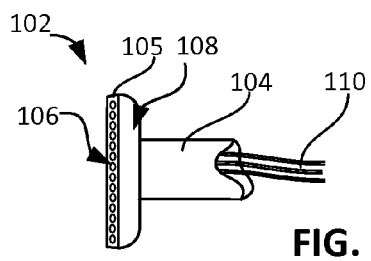
FIGS. 1A-1H illustrate example configurations of piezoelectric transducer devices that include array(s) of curved vibrating elements.

A piezoelectric ultrasonic transducer device is capable of generating high frequency pressure waves in a propagation medium (e.g., air, water, tissue, bone, metal, etc.) using a piezoelectric transducer array vibrating in response to a high frequency time-varying driving voltage. An exposed outer surface of the vibrating transducer array can be placed close to or in contact with the propagation medium to couple the energy carried by the vibrations of the exposed outer surface to the energy carried by the pressure waves propagating along one or more directions in the propagation medium. An ultrasonic transducer device typically generates sound waves with frequencies above the human audial range. However, in some implementations, piezoelectric transducer devices made according to the descriptions in this specification can be used to generate sound waves with frequencies within or below the human audial range as well.

When the pressure waves encounter variations in density or elastic modulus (or both) either within the propagation medium or at a boundary between media, the pressure waves are reflected. Some of the reflected pressure waves can be captured by the exposed outer surface of the transducer array and converted to voltage signals that are sensed by the sensing circuits of the ultrasonic transducer device. The sensed voltage signals can be processed in conjunction with the driving voltage signals to obtain information on the variations in density or elastic modulus (or both) within the propagation medium or at the boundary between the media.

When the vibrations of each vibrating element in the vibrating transducer array are individually controlled and timed with respective time delays and frequencies, a wave front having a desired shape, size, direction, and speed can be generated. The size and pitch of the vibrating elements, the layout of the transducer array, the driving frequencies, and the respective time delays and locations of the vibrating elements, can be used in conjunction with the respective strength and timing of the sensed voltage signals on the vibrating elements, to determine the variations in density or elastic modulus (or both) either within the propagation medium, and to deduce the locations, sizes, shapes, and/or speeds of the objects and/or structural variations encountered by the pressure waves in the propagation medium. The deduced information on the locations, size, shapes, and/or speeds of the objects and/or structure variations in the propagation medium can be presented on an external display device, for example, as colored or monochromatic images. Ultrasonic transducer devices can find many applications in which imaging of internal structural variations within a medium or multiple media is of interest, such as in medical diagnostics, product defect detection, minimally-invasive surgery equipment, etc.

In this specification, piezoelectric transducer devices having transducer arrays formed of curved vibrating elements are disclosed. A curved vibrating element includes a curved piezoelectric element disposed between a pair of curved electrodes that have respective curved surfaces matching the curved surfaces of the piezoelectric element. The curved vibrating element exhibits a larger displacement in response to a given driving voltage and better sensing sensitivity as compared to a flat vibrating element.

In addition, the transducer array can be fabricated and integrated with an Application-Specific Integrated Circuit (ASIC) wafer using semiconductor fabrication processes. The ASIC wafer includes integrated circuitry for controlling the driving and sensing functions of the transducer device and requires only a small number of external connections to transmit driving signals to and collect sensed signals from the large number of vibrating elements in the transducer array.

Therefore, a transducer device containing an array of curved vibrating elements and an integrated ASIC wafer as disclosed in this specification can be compact, light-weight, have better driving and sensing efficiencies, and require lower driving voltages as compared to conventional transducer arrays formed of flat piezoelectric films or element made from diced bulk piezoelectric materials.

In some implementations, rather than including an ASIC wafer, the transducer device can include an electrical interconnect layer. The traces for the individual transducers can be moved to the interconnect layer so that the high density array of vibrating elements can still be achieved. The circuitry for controlling the driving and sensing functions for the transducer device can be located elsewhere in the device (e.g., external to the base or upstream to the interconnect layer).

In some implementations, the transducer device can include an array of flat vibrating elements along with the integrated ASIC wafer. The flat vibrating elements can be formed by sputtering piezoelectric material or etching (e.g. plasma etching) bulk piezoelectric material. Sputtering piezoelectric material or etching bulk piezoelectric material rather than sawing allows the vibrating elements to have a wide variety of desired shapes, such as shapes with rounded corners, circular shapes, pentagons, hexagons, or any other shape. This facilitates wafer level integration into a MEMs device. Further, the density of the transducer array is not limited by the size of a saw blade as is the case with diced bulk piezoelectric vibrating elements.

FIGS. 1A-1G illustrate example configurations of piezoelectric transducer devices that include array(s) of curved vibrating elements.

In some implementations, a transducer device includes a linear or one-dimensional transducer array. The curved vibrating elements in the one-dimensional transducer array are distributed along a straight line. The vibrating outer surface of the linear transducer array can be substantially within a plane parallel to the straight line. As shown in FIG. 1A, the transducer device 102 includes a handle portion 104. The linear transducer array 106 can be attached to the handle 104 at one distal end 108 of the handle 104, where the shape of the handle 104 is modified (e.g., widened, flattened, etc.) to accommodate the shape and size of the transducer array 106. In this example, the vibrating outer surface of the transducer array 106 faces a forward-direction along the long axis of the handle 104, i.e., the outer surface 105 of the substrate on which the array 106 is fabricated is perpendicular to the long axis of the handle 104. In other implementations, the exposed outer surface of the linear transducer array 106 can face to the side along a direction perpendicular (or at an acute angle) to the long axis of the handle 104. An operator of the transducer device 102 can manipulate the handle 104 to change the direction and location of the vibrating outer surface of the linear transducer array 106 as desired (e.g., facing the area(s) to be imaged).

The piezoelectric transducer device 102 can optionally include an integrated ASIC wafer (not shown) below the linear array of vibrating elements 106 and inside the handle portion 104 (e.g., inside the widened and flattened first distal end 108). Wires 110 connecting to the external input connections of the ASIC wafer can exit from the back end of the handle 104 and be connected to external equipment (e.g., a control device and/or a display device).

In some implementations, transducer devices can include two dimensional transducer arrays. Each two-dimensional transducer array can include multiple curved vibrating elements distributed in a two-dimensional array. The area covered by the two-dimensional array can be of various shapes, e.g., rectangular, square, circular, octagonal, hexagonal, circular, and so on. The vibrating elements in the two-dimensional array can be distributed on a lattice consisting of straight lines (e.g., a square lattice or hexagonal lattice) or of more complex patterns. The vibrating outer surface of the two-dimensional transducer array can be substantially within a plane as well. The two-dimensional transducer array can be attached to a handle (e.g., at one distal end of a straight cylindrical handle) to form the transducer device. The plane of the vibrating outer surface of the transducer array can face forward, e.g., be perpendicular to, the long axis of the handle (e.g., as shown in FIG. 1B), or face to the side, i.e., be parallel (or at an acute angle), to the long axis of the handle (e.g., as shown in FIG. 1C).

An operator of the transducer device can manipulate the handle of the transducer devices to change the facing direction and location of the vibrating outer surface of the two-dimensional transducer array as desired (e.g., facing the area(s) to be imaged).

Figure 1B:
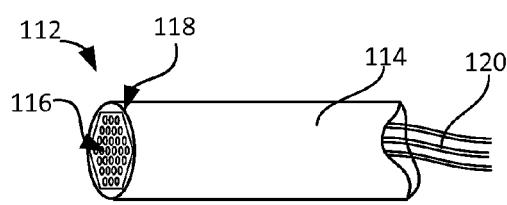

As shown in FIG. 1B, the piezoelectric transducer device 112 includes a forward facing hexagonal transducer array 116 attached to a handle 114 at a first distal end 118. The piezoelectric transducer device 112 can optionally include an integrated ASIC wafer (not shown) below the hexagonal array of vibrating elements and inside the handle portion 114. Wires 120 connecting to the external connections of the ASIC wafer can exit from the back (e.g., a second distal end) of the handle 114 and be connected to external equipment (e.g., a control device and/or a display device). The forward facing transducer device 112 can be used for intravascular ultrasound (IVUS) imaging, which is not feasible with conventional ultrasound imaging.

Figure 1C:
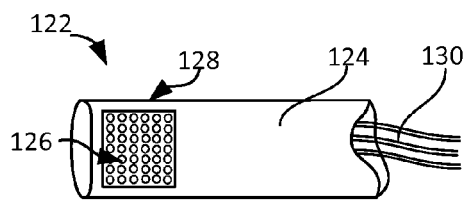

FIG. 1C shows a piezoelectric transducer device 122 that includes a side-facing square transducer array 126 attached to a handle 124 at a first distal end 128. The piezoelectric transducer device 122 can optionally include an integrated ASIC wafer (not shown) on the back of the square array of vibrating elements and inside the handle portion 124. Wires 130 connecting the external connections of the ASIC wafer can exist from the back (e.g., a second distal end) of the handle 124 and be connected to external equipment (e.g., a control device and/or a display device).

In some implementations, a transducer device can include a one-dimensional transducer array or a two-dimensional transducer array that is wrapped along a curved line or around a curved surface, such that the vibrating outer surface of the transducer array is a curved line or curved surface.

Figure 1D:
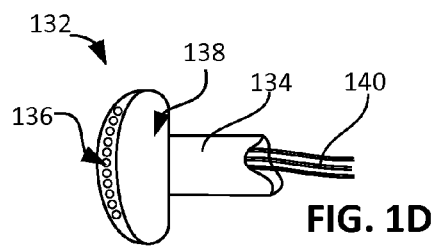

For example, FIG. 1D shows an example transducer device 132 that includes a linear transducer array 136 that runs along a curved line and attached to a handle 134 at a first distal end 138 (e.g., an enlarged, curved, and flattened portion) of the handle 134. The transducer device 132 also includes wires 140 connected to an ASIC wafer (not shown) and exiting a back end of the handle 134.

Figure 1E:
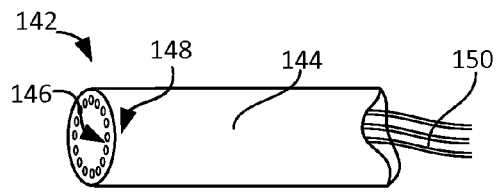

FIG. 1E shows an example transducer device 142 that includes a forward-facing linear transducer array 146 that runs around the circumference of a circle and attached to a handle 144 at a distal end 148 of the handle 144. The transducer device 142 also includes wires 150 connected to an ASIC wafer (not shown) and exiting a back end of the handle 144.

Figure 1F:
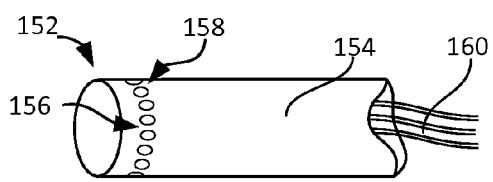

FIG. 1F shows an example transducer device 152 that includes a side-facing linear transducer array 156 that runs around the circumference of a circle and attached to a handle 154 at a distal end 158 of the handle 154. The transducer device 152 also includes wires 160 connected to an ASIC wafer (not shown) and exiting a back end of the handle 154.

Figure 1G:
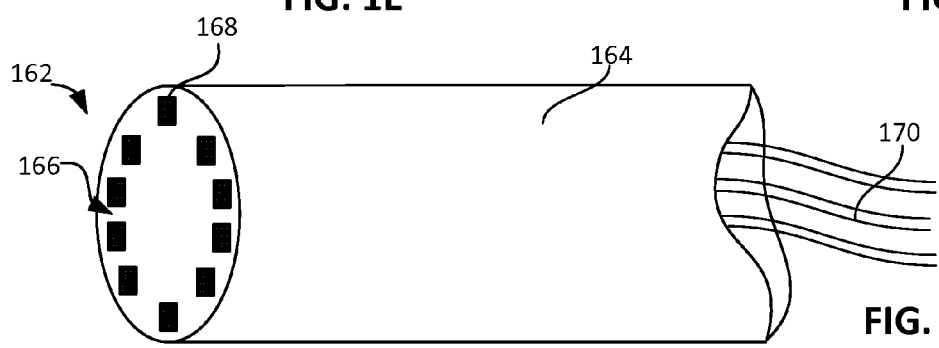

In some implementations, each vibrating element of the linear transducer arrays 136, 146, and 156 shown in FIGS. 1D, 1E, and 1F can be replaced by a small two-dimensional sub-array. For example, each sub-array can be a small square transducer array. As shown in FIG. 1G, a transducer device 162 includes a forward-facing two-dimensional annular array 166 formed of multiple square sub-arrays of vibrating elements (e.g., square sub-arrays 168), where the forward-facing annular array 166 is attached to a first distal end of a handle 164 of the transducer device 162. The transducer device 162 also includes wires 170 connected to an ASIC wafer (not shown) and exiting a back end of the handle 164.

Figure 1H:
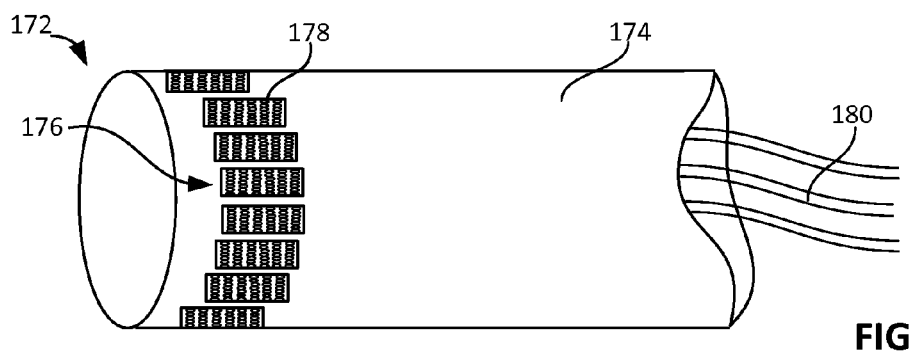

Similarly, as shown in FIG. 1H, a transducer device 172 includes a side-facing array 176 formed of multiple square sub-arrays of vibrating elements (e.g., square sub-arrays 178), where the side-facing array 176 is attached to a first distal end of a handle 174 of the transducer device 172. The transducer device 172 also includes wires 180 connected to an ASIC wafer (not shown) and exiting a back end of the handle 174.

The configurations of the transducer devices shown in FIGS. 1A-1H are merely illustrative. Different combinations of the facing direction (e.g., forward-facing, side-facing, or other facing angles) and overall shape (e.g., flat or curved, linear, polygonal, or annular) of the vibrating outer surface of entire transducer array, the positions of the transducer array on the handle, and the layout of the vibrating elements on the transducer array are possible in various implementations of the transducer devices.

In addition, depending on the applications (e.g., the desired operating frequencies, imaged area, imaging resolutions, etc.), the total number of vibrating elements in the transducer array, the size of the transducer array, and the size and pitch of the vibrating elements in the transducer array can also vary. In one example, a linear array includes 128 vibrating elements of 50 micron radii at a 200 micron pitch. In another example, a square array includes 16 vibrating elements of 75 microns at a 200 micron pitch. Other example configurations are described in other parts of the specification.

Figure 2A:
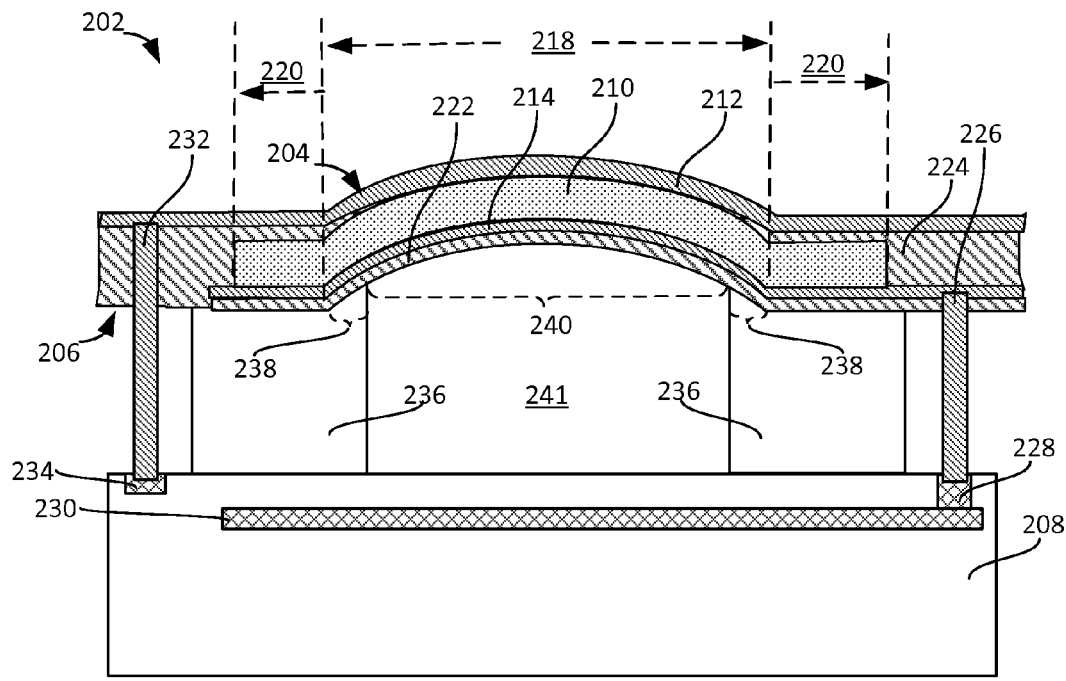
FIG. 2A-2B illustrate vertical cross-sections of two example piezoelectric transducer devices including curved vibrating elements.
Figure 2B:
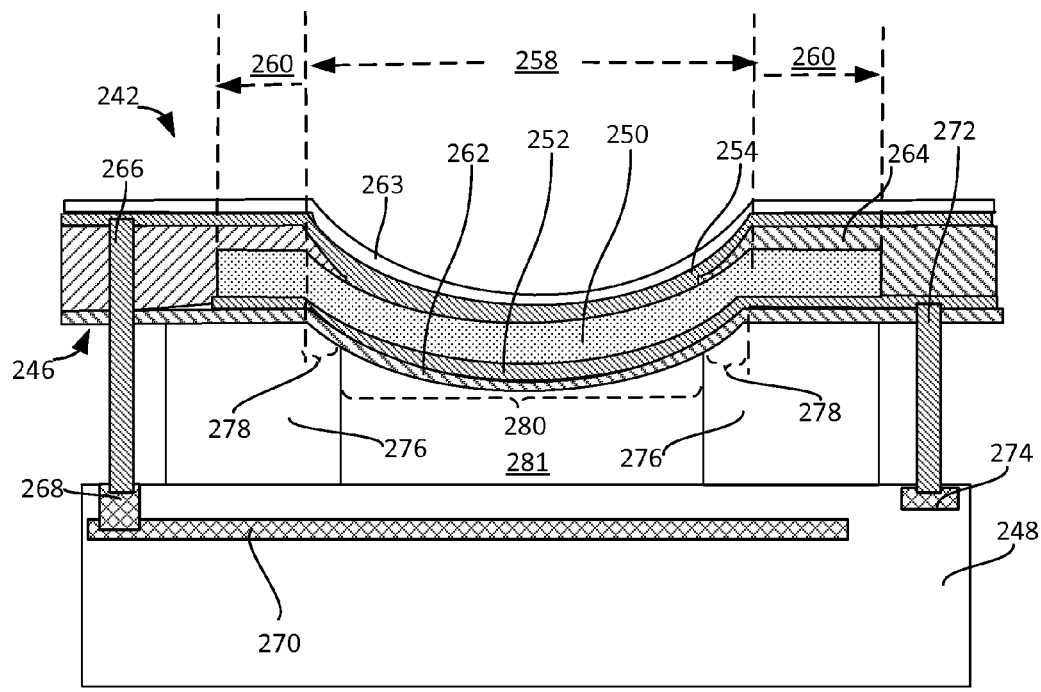

As disclosed in this specification, a transducer array of a transducer device includes multiple curved piezoelectric vibrating elements. FIGS. 2A-2B illustrate two example configurations of a curved piezoelectric vibrating element.

In FIG. 2A, a convex or dome-shaped vibrating element 202 is shown. The convex vibrating element 202 includes a top surface 204 that is exposed and forms a portion of the vibrating outer surface of the transducer array (e.g., along with the top surfaces of other vibrating elements in the transducer array). The vibrating element 202 also includes a bottom surface 206 that is attached to a top surface of a base 208.

As shown in FIG. 2A, the dome-shaped vibrating element 202 includes a convex or dome-shaped piezoelectric element 210 disposed between a reference electrode 212 and a drive electrode 214. In this example, the reference electrode 212 is disposed over the top surface (farther from the base 208) of the convex piezoelectric element 210, while the drive electrode 214 is disposed below the bottom surface (closer to the base 208) of the convex piezoelectric element 210. In an alternative example (not shown), the drive electrode can be disposed over the top surface of the convex piezoelectric element, while the reference electrode is disposed below the bottom surface of the convex piezoelectric element.

As shown in FIG. 2A, the convex piezoelectric element 210 is a thin layer of piezoelectric material that is of substantially the same thickness throughout. The thin layer of piezoelectric material includes a curved portion 218 surrounded by a planar portion 220. The central curved portion 218 curves away from the base 208 to which the vibrating element 202 is attached. The convex piezoelectric element 210 can be formed by depositing (e.g., sputtering) piezoelectric material particles in a uniform layer on a profile-transferring substrate that has a dome formed on a planar top surface, for example. An example piezoelectric material that can be used to form the piezoelectric element 210 includes Lead Zirconate Titanate (PZT).

Further as shown in FIG. 2A, the convex piezoelectric element 210 is disposed over a drive electrode 214 on a top surface of the drive electrode 214. The drive electrode 214 can be a thin layer of conductive material that has a top surface in contact with and conforms to the bottom surface of the convex piezoelectric element 210. Therefore, the drive electrode 214 also includes a central curved portion that curves away from the base 208, and a planar portion adjoining (e.g., surrounding) the central curved portion. The central curved portion of the drive electrode 214 and the central curved portion of the convex piezoelectric element 210 have matching surface profiles.

In some implementations, the drive electrode 214 can be formed by depositing a thin layer of conductive material over a profile-transferring substrate that has a dome formed on a planar top surface. After the layer of conductive material (i.e., the drive electrode layer in this example) is deposited on the profile-transferring substrate, the deposited drive electrode layer can then serve as the profile-transferring substrate on which the thin layer of piezoelectric material for the piezoelectric element 210 can be deposited. The conductive materials for the drive electrode layer can include one or more of various metals (e.g., Au, Pt, Ni, Ir, etc.), alloys (e.g., Au/Sn, Ir/TiW, Au/TiW, AuNi, etc.), metal oxides (e.g., IrO2, NiO2, PtO2, etc.), or combinations thereof, for example.

In some implementations, suitable methods for depositing the piezoelectric material over the drive electrode layer include, for example, sputtering, chemical vapor deposition, physical vapor deposition, atomic layer deposition, plasma-enhanced chemical vapor deposition, and so on. Types of sputter deposition can include magnetron sputter deposition (e.g., RF sputtering), ion beam sputtering, reactive sputtering, ion assisted deposition, high target utilization sputtering, and high power impulse magnetron sputtering. The thickness of the piezoelectric layer can be selected such that the piezoelectric element 210 is sufficiently flexible to flex under the driving voltages, and yet stiff enough to transfer its vibrations to the propagation medium in contact with the exposed outer surface of 204 of the vibrating element 202.

Further as shown in FIG. 2A, the reference electrode 212 is disposed over the top surface of the convex piezoelectric element 210. The reference electrode 212 can be a thin layer of conductive material that has its bottom surface in contact with and conforms to the top surface of the convex piezoelectric element 210. Therefore, the reference electrode 212 also includes a central curved portion that curves away from the base 208, and a planar portion adjoining (e.g., surrounding) the central curved portion. The central curved portion of the reference electrode 212 and the central curved portion of the convex piezoelectric element 210 have matching surface profiles.

In some implementations, the reference electrode 212 can be formed by deposition of a thin layer of conductive material over the deposited piezoelectric layer, for example, after the deposited piezoelectric layer has been patterned to define the piezoelectric element 210. The conductive materials for the reference electrode layer can include one or more of various metals (e.g., Au, Pt, Ni, Ir, etc.), alloys (e.g., Au/Sn, Ir/TiW, Au/TiW, AuNi, etc.), metal oxides (e.g., IrO2, NiO2, PtO2, etc.), or combinations thereof, for example.

Further as shown in FIG. 2A, in some implementations, the vibrating element 202 can optionally include a thin membrane layer 222 below the drive electrode 214 and in contact with the bottom surface of the drive electrode 214. In some implementations, to form to the vibrating element 202, the thin membrane layer 222 can be deposited on a domed profile-transferring substrate first. Then, the drive electrode layer can be deposited on the top surface of the thin membrane layer 222. After the drive electrode layer is deposited, the piezoelectric layer can be deposited on the drive electrode layer. Piezoelectric layer and the drive electrode layer can be patterned to form individual drive electrode 214 and piezoelectric element 210, before the reference electrode layer is deposited on the piezoelectric element. In some implementations, the profile transferring substrate on which the membrane layer 222 is deposited can be etched away from the bottom up to expose the central curved portion of the bottom surface of the thin membrane 222, such that the central curved portion can flex under an applied voltage. In some implementations, the membrane layer 222 can be an oxide layer that functions as an etch stop for the etching process.

In some implementations, after the piezoelectric element 210 is formed on top surface of the drive electrode 214, and before the reference electrode layer is deposited, a layer of dielectric membrane 224 (e.g., a $SiO_2$, $SiN_2$, or combination thereof) can be deposited on the top surface of the piezoelectric element 210. The central portion of the membrane 224 over a central portion of the curved portion 218 of the piezoelectric element 210 can be etched open to expose the central top surface of the piezoelectric element 210. Then the reference electrode layer can be deposited over the exposed top surface of the piezoelectric element 210, such that the bottom surface of the reference electrode 212 comes in contact with and conforms to the exposed top surface of the dielectric membrane 224 and the exposed top surface of the piezoelectric element 210. The dielectric membrane 224 can serve to insulate the drive electrode 214 from the reference electrode 212. In addition, the dielectric membrane 224 can also serve to insulate the reference electrode 212 from the piezoelectric element 210 in areas of the piezoelectric element 210 that are kept stationary during operation (e.g., including the peripheral portions 238 and the planar portions 220 of the piezoelectric element 210). By insulating the reference electrode 212 from the piezoelectric element 210 in areas that are kept stationary, internal stress experienced by the piezoelectric element due to the driving voltages applied in those areas can be reduced.

In some implementations, where there are only a small number of vibrating elements in the transducer array, electrical connections to the drive electrode and the reference electrode of each vibrating element can be made through conductive traces that run in a same plane parallel to the top surface of the base 208. In some implementations, the reference electrode of several vibrating elements can be joined to form a common reference electrode that spans multiple vibrating elements. In some implementations, where there are many vibrating elements distributed in a small lateral area, there may not be enough space between individual vibrating elements to run conductive traces in a single plane parallel to the top surface of the base 208. Instead, a respective vertically-oriented electrical interconnect can be made for each of some or all vibrating elements in the transducer array to connect the vibrating element to the control/sensing circuitry in the base 208. As shown in FIG. 2A, a vertically-oriented electrical interconnect 226 is used to electrically connect the drive electrode 214 to an active connection pad 228 of the control/sensing circuits 230 in the base 208. In addition, a vertically-oriented electrical interconnect 232 is used to electrically connect the reference electrode 212 to a ground connection pad 234 of the control/sensing circuit 230 in the base 208. In some implementations, where a common reference electrode spanning the entire transducer array is used, only one electrical connection is needed to electrically connect the common reference electrode to the ground connection pad in the base 208.

In some implementations, as shown in FIG. 2A, the flexible portion of the vibrating element 202 is suspended above the top surface of the base 208. The spacing between the top surface of the base 208 and the bottom surface 206 of the vibrating element 202 can be created by a support 236, e.g., an annular support, having a hole 241 vertically aligned with the curved portion 218 of the vibrating element 202. The support 236 has a bottom surface attached to the top surface of the base 208, and a top surface attached to the bottom surface 206 of vibrating element 202. In implementations where no membrane 222 exists below the drive electrode 214, the bottom surface of the drive electrode can serve as the bottom surface 206 of the vibrating element 202. If the membrane 222 exists, the bottom surface of the membrane 222 can serve as the bottom surface of the vibrating element 202. The support 236 can also serve to isolate individual vibrating elements on the base 208 to reduce cross-talk between adjacent vibrating elements. In some implementations, the height of the support can be very small, such that only a small gap (e.g., a few microns) exists between the central vibrating portion (in other words, the flexible portion) of the vibrating element 202 and the top surface of the base 208. In some implementations, the height of the support 236 can be thicker, e.g., 10-50 microns or more.

In the example configuration shown in FIG. 2A, the reference electrode 212 is positioned over the piezoelectric element 210, while the drive electrode 214 is positioned below the piezoelectric element 210. In an alternative configuration, the reference electrode can be positioned below the piezoelectric element, while the reference electrode is positioned above the piezoelectric element. The vibrating element having the alternative configuration can be formed in a similar manner as described above, except that a lower metal layer can be used as the reference electrode layer, while the higher metal layer can be used as the drive electrode layer. In addition, the vertically-oriented electrical interconnects will each reach into a different metal layer in the vibrating element.

Continuing with the example shown in FIG. 2A, in some implementations, a protective membrane (not shown), e.g., a non-wetting coating, a PECVD oxide coating or the like, can be deposited on the top surface of the reference electrode 212. In some implementations, the protective membrane can be a continuous layer deposited over the entire top surface of the transducer array. The top surface of the protective membrane can be exposed and free of any additional layers deposited on top. In operation, the exposed top surface of the optional protective membrane can be put into direct contact with the propagation medium (which could be the material of interest, e.g., tissue, or a coupling medium, e.g., an ultrasound transmission gel) such that vibrations of the vibrating elements in the transducer array can be coupled into pressure waves in the propagation medium.

The optional protective membrane can protect the vibrating element 202 from dust and contamination, and possibly corrosion due to moisture or other substances in the propagation medium. In addition, a protective membrane may be advantageous in implementations where the drive electrode is placed above the piezoelectric element 210 while the reference electrode is placed below the piezoelectric element 210, and where the protective membrane can serve as an insulation layer between the drive electrode (now positioned on the top of the vibrating element) and the propagation medium (e.g., a patient's skin or tissue).

In some implementations, no protective membrane is used in the vibrating element 202 and the top surface of the reference electrode 212 can be exposed to the propagation medium directly when in use. For example, in cases where a continuous reference electrode is used to cover the entire transducer array and the continuous reference electrode is made of an inert metal (e.g., Au or Pt) resistant to corrosion and contamination, and where the reference electrode is kept at an earth ground potential, then the continuous reference electrode can serve as the exposed outer surface of the transducer device that is used to couple vibrations of the vibration elements to the propagation medium.

In some implementations, as shown in FIG. 2A, the curved portion of the vibrating element 202 (including the central flexible portions of the reference electrode, piezoelectric element, and drive electrode, and any additional membrane layers above, below, or in between the reference electrode, piezoelectric element, and/or drive electrode) remain curved in the absence of any applied voltage between the drive electrode and the reference electrode. When a time-varying driving voltage is applied between the drive electrode 214 and the reference electrode 212, the curved portion (or a central portion thereof) of the vibrating element 202 can vibrate in response to the time-varying driving voltage.

In some implementations, only the planar portion of the vibrating element 202 is affixed to the base 208 (e.g., by the support 236), and remains stationary during operation, while the entire curved portion of the vibrating element 202 vibrates in response to the time-varying driving voltage. In some implementations, however, a peripheral portion 238 of the curved portion can also be affixed to the base 203 by the support 236, such that the peripheral portion 238 of the curved portion can remain stationary during operation, while only the central portion 240 of the curved portion vibrates in response to the time-varying driving voltage. In some of the implementations where the peripheral portion 238 of the curved portion is affixed to the base, all or some of the planar portion of the vibrating elements can be removed.

In some implementations, the peripheral portion 238 that is affixed and kept stationary can account only a small width relative to the lateral dimension of the curved portion 218. As will be shown later in the specification, by keeping a small peripheral portion 238 of the curved portion 218 stationary during operation, stress at the transition points between the curved portion 218 and the planar portion 220 of the piezoelectric element 210 can be reduced, extending the lifetime of the vibrating element 210.

In some implementations, where the peripheral portion 238 of the curved portion 218 of the piezoelectric element 210 is affixed and kept stationary during operation, the planar portion 220 surrounding the peripheral portion 238 of the curved portion 218 can be reduced in size or eliminated completely in the vibrating element 202, as long as the hold on the peripheral portion 238 by the support 236 is of sufficient strength and durability to prevent the piezoelectric element 210 from delaminating from the electrodes 212 and 214 during an acceptable life time for the piezoelectric transducer device.

FIG. 2B shows another example configuration for a vibrating element 242 in which a concave piezoelectric element 250 is used. The vibrating element 242 can be constructed similarly to the vibrating element 202, except as described below. In the example vibrating element 242, the reference electrode 252 is disposed below the bottom surface of the concave piezoelectric element 250, while the drive electrode 254 is disposed above the top surface of the concave piezoelectric element 250. An optional membrane layer 262 can be disposed below the bottom surface of the reference electrode 252. The bottom surface 246 of the vibrating element 242 can be the bottom surface of the membrane layer 262, if present, or the bottom surface of the reference electrode 252, if no membrane layer 262 is used. In addition, a dielectric layer 264 can be deposited over the piezoelectric element and the reference electrode layer to insulate the drive electrode 254 from the reference electrode 252 and to insulate the drive electrode 154 from the piezoelectric element 250 in areas outside of the central area on the top surface of the piezoelectric element 250.

In addition, an optional protective membrane 263 can be used to cover the top surface of the drive electrode 254. The top surface of the protective membrane 263 can serve as the exposed top surface of the vibrating element 242 and put in contact with the propagation medium during operation. In some implementations, the protective membrane 263 is a thin dielectric layer that serves to insulate the drive electrode 254 from the propagation medium.

In addition, a vertically oriented electrical interconnect 266 can electrically connect the drive electrode 254 to the active connection pad 268 of the control/sensing circuitry 270 in the base 248. A vertically-oriented electrical interconnect 272 can electrically connect the reference electrode 252 to the ground connection pad 274 of the control/sensing circuitry 270 in the base 248. In some implementations, the reference electrode 252 can be a continuous conductive layer that spans the entire transducer array in a transducer device.

Although the example shown in FIG. 2B has the reference electrode 252 disposed closer to the base 248, while the drive electrode 254 is disposed farther away from the base 248, in an alternative implementation, the positions of the reference electrode 252 and the drive electrode 248 can be reversed. When the positions of the reference electrode 252 and the drive electrode 254 are reversed, the lengths of the electrical interconnects 266 and 272 can be adjusted to connect to the appropriate electrode in the vibrating element 242.

As shown in FIG. 2B, the vibrating element 242 is similar to the vibrating element 202 shown in FIG. 2A, except that the piezoelectric element 250, the drive electrode 254, and the reference electrode 252 each include a respective curved portion that curves toward the base 248. In some implementations, the concave reference electrode 252, piezoelectric element 250, and drive electrode 254 can be formed by sequentially depositing the reference electrode layer, the piezoelectric layer, and the drive electrode layer on the top surface of a profile-transferring substrate that has a dented portion (or inverted dome) surrounded by a planar portion.

In some implementations, similar to the vibrating element 202 shown in FIG. 2A, in addition to the planar portion 260 of the piezoelectric element 242, the peripheral portion 278 of the curved portion 258 of the vibrating element 242 is also kept stationary during operation, while only the central portion 280 of the curved portion 258 vibrates in response to the time-varying driving voltage.

While FIGS. 2A and 2B show the electrical interconnects 226, 232, 266, 272 contacting a bottom surface of electrodes 214, 212, 254, 252 in some implementations, the electrical interconnects can contact a top surface of the electrodes.

In some implementations, the vibrating element 242 is suspended above and attached to the base 248 by a support 276 (e.g., an annular support with a hole 281 aligned with the curved portion 258 of the piezoelectric element 250). Since a concave vibrating element 242 is used in the example configuration shown in FIG. 2B, the spacing between the bottom surface 246 of the vibrating element 242 and the top surface of the base 248 should be large enough to keep the bottom of the vibrating portion 280 from making contact with the top surface of the base 242 when the vibrating element 242 is experiencing a maximum displacement under a driving voltage or impinging pressure. Thus, the thickness of the support 276 should be selected to accommodate the maximum displacement that is anticipated for the vibrating element 242.

Although a support 276 is used to support and suspend the vibrating element shown in FIGS. 2A and 2B, in some implementations, a cavity can be formed in the base (e.g., the base 208 or 248) below the flexible portion of the vibrating element (e.g., the vibrating element 202 or 242) to create the space for accommodating the displacement of the vibrating element during operation (e.g., driving and/or sensing). Alternatively, the electrical interconnect 226, 272 can be a support (e.g. an annular support) that defines the height between the vibrating element 202, 252 and the base 208, 248 rather than supports 236, 276.

While FIGS. 2A and 2B show piezoelectric element 210, 250 as a discrete element for an individual vibrating element, the piezoelectric element can be a continuous layer for multiple vibrating elements.

Figure 3A:
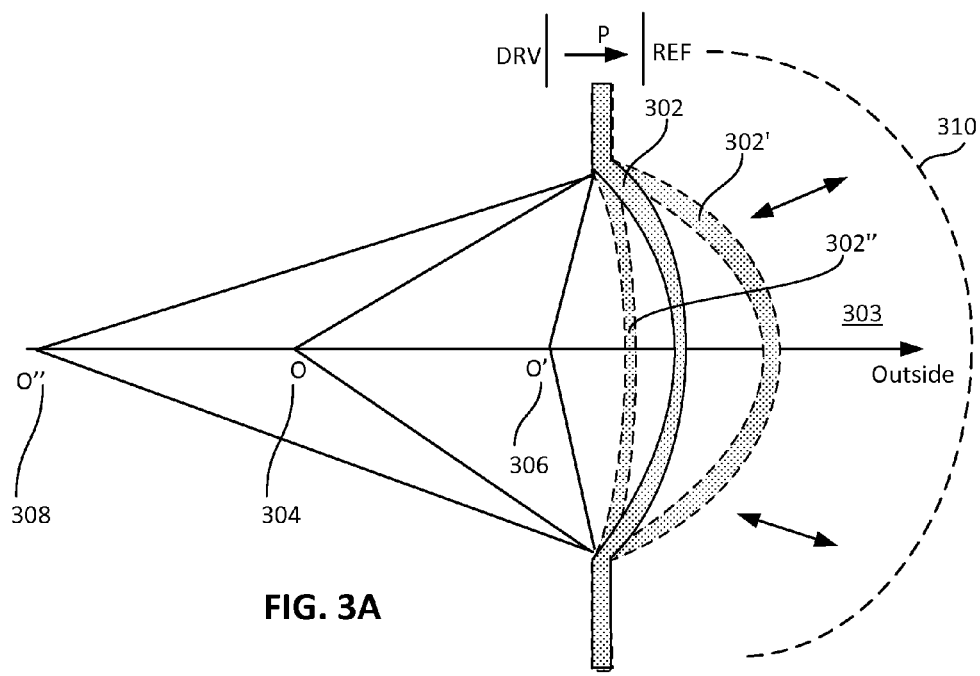
FIGS. 3A-3B are each a schematic illustration of the deflections of a curved piezoelectric element under an applied voltage or mechanical pressure.

While FIGS. 2A and 2B show curved vibrating elements 202, 242, the vibrating elements can alternatively be flat. FIG. 3A is a schematic diagram illustrating the deformations of the convexly curved piezoelectric element 302 under an applied voltage (e.g., during driving) and an applied mechanical pressure (e.g., during sensing).

In FIG. 3A, suppose that the piezoelectric element 302 has an as-deposited poling direction that points from the left surface of the piezoelectric element 302 to the right surface of the piezoelectric element 302, and that is locally perpendicular to the two surfaces of the piezoelectric element 302.

Further suppose a drive electrode (not shown) is disposed next to the left surface of the piezoelectric element 302, while a reference electrode (not shown) is disposed next to the right surface of the piezoelectric element 302. This configuration corresponds to the configuration shown in FIG. 2A, for example. Based on the above configuration, a positive voltage applied across the piezoelectric element 302 between the drive electrode and the reference electrode can cause an electric field in the piezoelectric element 302 pointing from the left surface to the right surface of the piezoelectric element 302. In other words, the applied positive voltage causes an electric field in the piezoelectric element 302 that is locally aligned and parallel to the poling direction in the piezoelectric element 302. As a result, the piezoelectric element 302 contracts and the curved portion of the piezoelectric element 302 retracts to the left (shown as piezoelectric element 302"), moving the center O of the curved vibrating element 302 along its central axis from a resting position 304 to a new position 308 to the left of the position 304. When the applied positive voltage is removed, the curved portion of the piezoelectric element 302 expands back to its original shape, and the center O of the curved vibrating element 302 is restored to its original resting position 304. The vibrating of the piezoelectric element 302 can send a pressure wave 310 into the propagation medium 303 on the right of the piezoelectric element 302.

In some implementations, when a negative voltage is applied across the piezoelectric element 302 between the drive electrode and the reference electrode, the piezoelectric element 302 can expand and the center O of the curved piezoelectric element 302 (now shown as 302') can be moved further to the right of the resting position 304 to a new position 306. When the negative voltage is removed, the center O of the curved piezoelectric element 302 can be restored to its original resting position 304.

In some implementations, a driving signal including alternating negative voltage and positive voltage signals can be used to cause the vibrating element to vibrate between a maximum positive and a maximum negative displacement positions (e.g., positions associated with the center positions 306 and 308). In some implementations, only positive voltages are used to drive the vibrating elements, and the positive voltage signals can be applied as pulses over a constant reference voltage. In some implementations, it is advantageous to avoid using negative voltage signals when driving the vibrating elements. For example, in the configuration shown in FIG. 3A, a negative driving voltage would induce an electric field that is antiparallel to the poling direction of the piezoelectric element 302, which may tend to depolarize the piezoelectric element 302 and lead to deteriorated performance of the piezoelectric element 302 over time.

In some implementations, when the vibrating element is in a sensing mode, and no voltage is applied to the curved piezoelectric element 302, the curved piezoelectric element 302 can deform in response to an applied mechanical pressure. For example, when pressure waves in the propagation medium 303 are reflected back toward the vibrating element and intercepted by the exposed surface of the vibrating element, the curved surface of the piezoelectric element 302 can be pushed from the resting position to a position left of the resting position. The center O of the curved piezoelectric element 302 can be moved from a resting position 304 to a new position to the left of the resting position 304. As a result of the deformation, a voltage difference can be caused between the left surface and the right surface of the vibrating element 302. The timing and the strength of the voltage difference can be used to determine the variations in density and elastic modulus in the propagation medium 303 (and hence, the position of the object or structural variations in the propagation medium 303) that caused the reflection of the pressure wave in the propagation medium 303.

In some implementations, the same vibrating elements in the transducer array can be used both for driving a pressure wave in the propagation medium 303 and for sensing reflected pressure waves from the propagation medium 303. The vibrating elements can switch between the driving and sensing mode based on control signals generated by a switching circuit in the base. In some implementations, the vibrating elements used for driving and sensing can be separated in the transducer array, for example, the driving vibrating elements and the sensing vibrating elements can be alternately distributed in the transducer array, and operate synchronously.

Although FIG. 3A shows a dome-shaped or convex piezoelectric element 302 having an as-deposited poling direction pointing to the right, the same principles used in driving and sensing the vibrations of the dome-shaped piezoelectric element also apply to driving and sensing the vibrations of a dent-shaped or convex piezoelectric element.

Figure 3B:
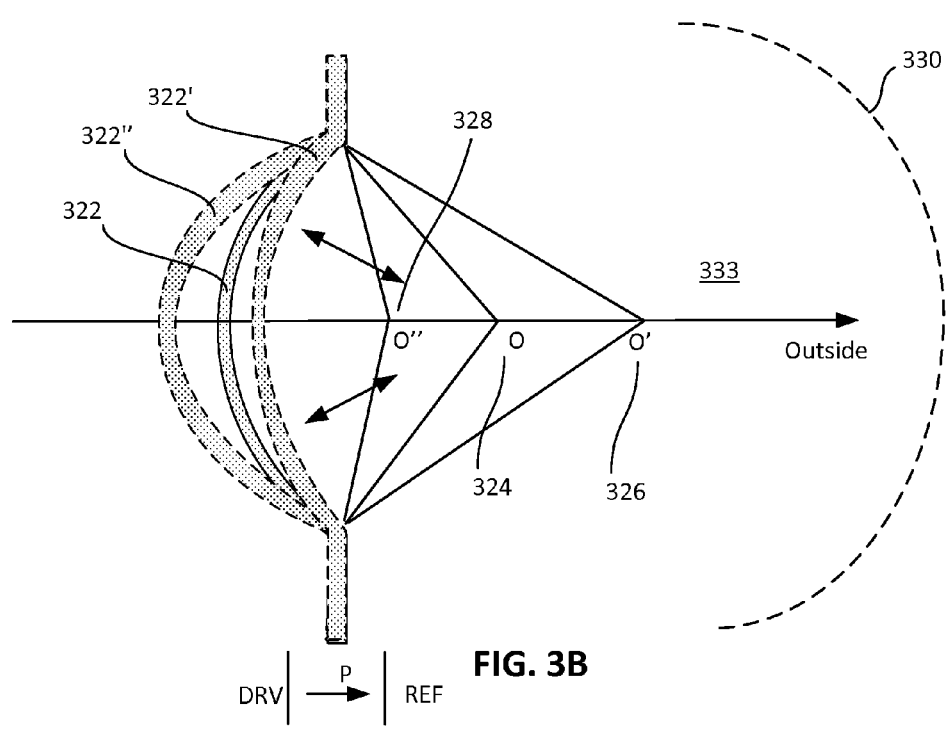

For example, as shown in FIG. 3B, suppose the dent-shaped piezoelectric element 322 has an as-deposited poling direction pointing from the left surface to the right surface of the piezoelectric element 322, a drive electrode (not shown) is disposed on the left side of the dent-shaped piezoelectric element 322, and a reference electrode (not shown) is disposed on the right side of the dent-shaped piezoelectric element 322.

According to the above configuration, when a positive voltage is applied between the drive electrode and the reference electrode, an electric field can be induced in the piezoelectric element 322. The induced electric field is aligned and parallel to the poling direction of the piezoelectric element 322. As a result, the piezoelectric element 322 can contract (e.g., represented by the piezoelectric element 322') and the center O of the curved piezoelectric element 322 can be shifted a new position 326 to the right of its resting position 324. When the positive voltage is removed, the piezoelectric element 322 is restored to its original resting shape. The vibration of the vibrating element 322 can excite a pressure wave 330 in a propagation medium 333 in contact with the exposed the concave surface of the vibrating element.

Similarly, when a reflected pressure wave exerts a mechanical pressure on the dent-shaped right surface of the vibrating element 322, the piezoelectric element 322 can be extended to the left (e.g., represented by the piezoelectric element 322"). The center O of the piezoelectric element 322 can be moved from its resting position 324 to a new position 328 and a voltage difference can be induced between the left surface and the right surface of the piezoelectric element 322. The timing and the strength of the voltage difference can be used to determine the variations in density and elastic modulus in the propagation medium 333 and deduce the locations of the objects or structural variations in the propagation medium 333 that caused the reflected pressure wave.

As set forth earlier, sputtered piezoelectric material can have a large as-deposited poling. Some environments that are used for sputtering the piezoelectric material include a direct current (DC) bias during sputtering. The DC field causes the piezoelectric material to be poled in the direction of the DC field. In some implementations, the as-deposited poling direction in the deposited piezoelectric layer (e.g., sputtered PZT) can be locally perpendicular to the surface of the underlying profile-transferring substrate, and pointing in a direction away from the substrate surface.

If a desired poling direction in the piezoelectric element is different from the as deposited poling direction, the piezoelectric membrane can be deposited on a profile-transferring substrate and then flipped over and bonded to another substrate to obtain the desired poling direction.

While FIGS. 3A and 3B show curved piezoelectric elements 302, 322, the piezoelectric elements can alternatively be flat.

Figure 4A:
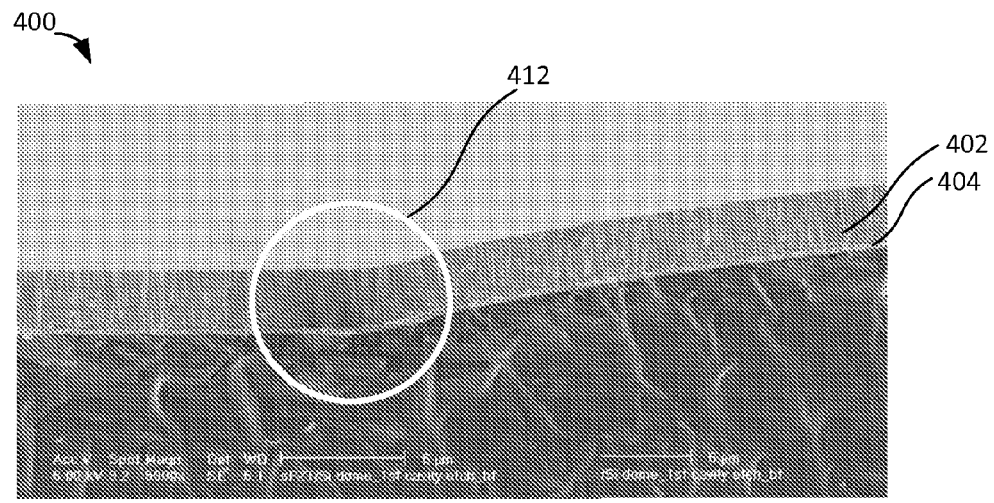
FIGS. 4A-4B are images showing the grain structures within a curved piezoelectric element formed by depositing piezoelectric material particles over a curved profile-transferring surface.

FIG. 4A shows a Scanning Electronic Microscope (SEM) image 400 of a partial cross-section of a convex piezoelectric membrane. The image 400 shows the grain structure of a sputtered PZT layer 402 deposited on a dome-shaped Iridium electrode layer 404. The dome-shaped Iridium electrode layer 404 is suspended over a silicon substrate.

The grain structures within the PZT layer 402 are roughly columnar, and all or substantially all columnar grains are locally perpendicular to the surface of the curved PZT layer 402. The aligned columnar PZT grain structures shown in FIG. 4A occur when the PZT is deposited or grown gradually on a curved underlayer (e.g., on the curved surface of an etch stop layer or profile-transferring substrate). The aligned columnar grain structures that are locally perpendicular to the curved surface of the piezoelectric membrane would not inherently occur in a bulk piezoelectric material that is ground into a curved membrane. Nor would such grain alignment and orientation inherently occur in a curved piezoelectric membrane formed by injection molding.

When the grain structures in the sputtered PZT membrane are aligned and locally perpendicular to the curved surface of the PZT membrane, a reduced amount of localized internal stress occur within the membrane during vibration of the membrane as compared to a membrane that has randomly oriented grain structures (e.g., such as in a membrane formed from bulk PZT or injection molding). With the reduced amount of localized internal stress, the PZT membrane having aligned columnar grains such as that shown in FIG. 4A can enjoy a longer usable life than the membranes produced using other conventional methods (e.g., by grinding or by injection molding).

Figure 4B:
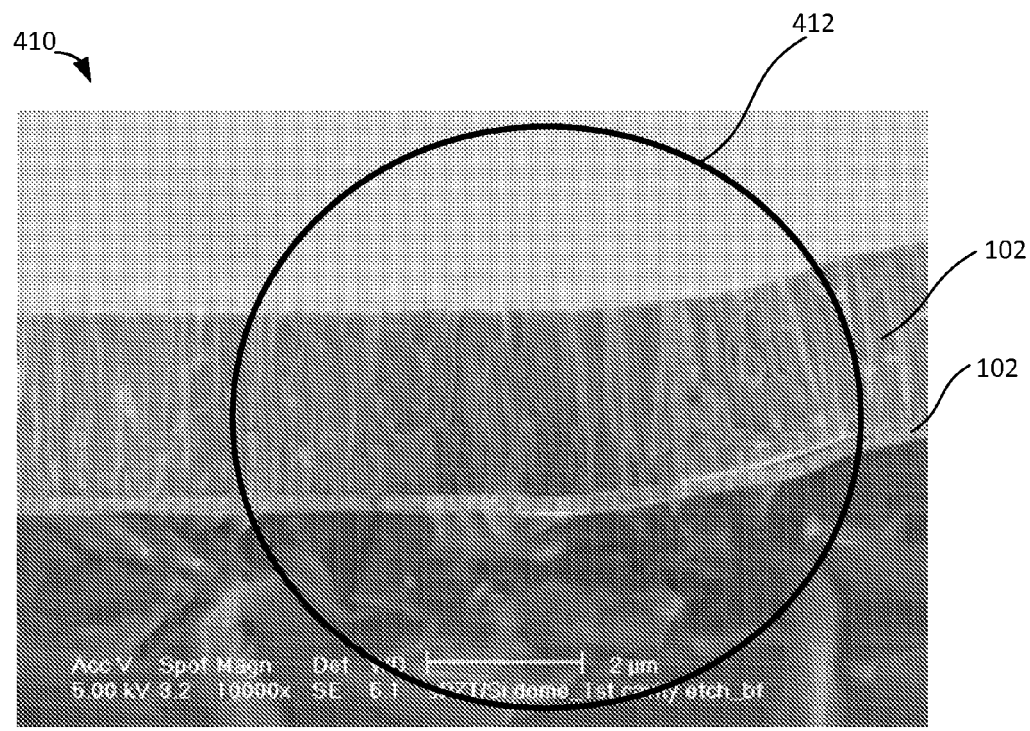

FIG. 4B is an enlarged SEM image 410 of the curved sputtered PZT membrane 402 near a transitional region 412 between a curved portion and a planar portion of the sputtered PZT membrane 402. The grain structures of the sputtered PZT in the transitional region 412 are squeezed toward the center of the transitional region 412. The transitional region 412 is less sturdy during vibration than other more homogeneous regions in the sputtered PZT membrane 402 where the grain structures are more parallel and aligned.

Normally, a larger amount of stress is created in the piezoelectric membrane near the boundary between the vibration portion and the stationary portion of the piezoelectric membrane during operation. As a result, if the transition point between the planar portion and the curved portion of the piezoelectric membrane 402 were placed exactly at the transition point between the vibrating portion and the stationary portion of the piezoelectric membrane 402 (e.g., when the piezoelectric membrane 402 is affixed to the base only at the planar portion and not at the curved portion of the piezoelectric membrane 402), the piezoelectric membrane 402 can be prone to breakage after prolonged usage.

In some implementations, a peripheral portion of the curved portion of the PZT membrane 402 can be affixed to the base, and kept stationary during operation (e.g., as shown in the configurations in FIGS. 2A-2B). In other words, the weaker transition point between the curved portion and the planar portion in the piezoelectric membrane 402 is moved away from the transition point between the vibrating portion and the stationary portion of the piezoelectric membrane 402. Instead, the transition point between the vibrating portion and the stationary portion is moved to a stronger, more aligned and homogeneous portion of the piezoelectric membrane 402 (e.g., in a curved portion of the piezoelectric membrane 402). By shifting the high stress region to the stronger region in the piezoelectric membrane 402, the piezoelectric membrane 402 is less prone to breakage due to the internal stress caused during vibration of the piezoelectric membrane 402.

While FIGS. 4A and 4B show a curved piezoelectric membrane including a sputtered piezoelectric layer 402 and electrode layer 404, the piezoelectric membrane can alternatively be flat. The flat sputtered piezoelectric layer has the same benefits of the columnar grain structure as the curved sputtered piezoelectric layer. The columnar grain structure is locally perpendicular to the surface of the flat piezoelectric layer. Because the flat piezoelectric layer is planar, it does not have a transition region between a curved portion and a planar portion. Thus, the flat piezoelectric membrane has more flexibility in where it can be attached to the base.

As shown above, FIGS. 2A-4B illustrate example designs and structures of individual vibrating elements that can be used in a transducer array of a transducer device. A piezoelectric transducer device can include one or more transducer arrays that each includes multiple vibrating elements. FIG. 5A illustrate an example hexagonal transducer array 502 that can be included in an ultrasonic transducer device 504. In an example implementation, approximately 1000 vibrating elements 506 with a size of 25 microns can be distributed within a hexagonal array 502 with a lateral dimension of approximately 3 mm. In another example implementation, approximately 400 vibrating elements with a size of 60 microns can be distributed within a hexagonal array with a lateral dimension of approximately 3 mm. In yet another example implementation, approximately 378 vibrating elements with a size of 60 microns can be distributed within a square array with a lateral dimension of 2.13 mm. The above dimensions are illustrative, other dimensions of the vibrating elements and array sizes, pitches, and layouts are possible. The above example dimensions can be suitable for ultrasonic devices for intravascular diagnostic or therapeutic uses, for example.

FIG. 5B shows a perspective view of a cross-section of the transducer array 502 in the transducer device 504 shown in FIG. 5A. As shown in FIG. 5B, the top surface 508 of the transducer array 504 is exposed, and can be put into contact with a propagation medium. When the top surface of the vibrating elements 506 in the transducer array 502 vibrates in response to driving voltages, the vibration of the top surface of the vibrating elements 506 can cause a pressure wave to be generated in the propagation medium.

As shown in FIG. 5B, the vibrating elements 506 in the transducer array 502 includes a vibrating portion 510 suspended above a cavity or hole 512 created by an annular support (e.g., the annular metal seal 514) attached to the vibrating portion 510 and top surface of the base 516. The annular metal seals 514 are attached to the planar portion of the vibrating elements 506 as well as the peripheral portion of the curved portion of the vibrating elements 506. In addition, the annular metal seal 514 supporting each vibrating element 506 is isolated from the annular metal seals supporting other vibrating elements 506, for example, by an air or vacuum gap 518. In some implementations, the thickness and width of the annular seal 514 are chosen such that the seal 514 substantially prevents vibrational crosstalk between adjacent vibrating elements 506 in the transducer array 502. In some implementations, a backing layer can be put within the cavity 512 above the top surface of the base 516 to absorb the energy transferred to the vibrating element 506 from reflected pressure waves, to reduce noise in the sensed signals and the echoes within the cavity 512 caused by the vibrations of the vibrating element 506.

While FIG. 5B show curved vibrating elements 506, the vibrating elements can alternatively be flat.

In some implementations, the annular metal seal 514 can be created by a eutectic bonding process. For example, the vibrating elements 506 and the base 516 of the transducer array 502 can be prepared in separate processes. Then, metals that can be bonded using a eutectic bonding technique can be plated on the bottom surface of the array of vibrating elements 506 and the top surface of the base 516, respectively, and at corresponding locations. Then the array of vibrating elements 506 can be bonded to the base 516 at the locations where the metals are plated. The bonded metals can form the annular seal 514 that attach the vibrating elements 506 to the base 516. In some implementations, other suitable materials (e.g., ceramics) may be used to form the seals.

In some implementations, the base 516 includes an ASIC layer for providing control signals to the vibrating elements and for registering (e.g., compress, package, and send out) the sensed signals received from the vibrating elements. Therefore, in addition to the annular seals 514, electrical connection pads and connection bumps can be plated on the top surface of the base 516 that leads to the electrical ground and the active elements of the driving/sensing circuits in the ASIC layer in the base 516. Corresponding electrical connection pads and connection bumps can be plated on the bottom surface of the transducer array 502, where the connection pads are electrically connected to individual drive electrodes of the vibrating elements 506 in the transducer array 502. The ASIC layer in the base 516 includes an array of driving or sensing integrated circuits that correspond to the transducer array 502, e.g., one circuit for each vibrating element 506. Each circuit in the array in the ASIC layer can have the same circuit structure and function. There is also an array of vertically-extending electrical interconnects corresponding to the transducer array 502 and corresponding to the array of circuits in the ASIC layer, e.g., at least one vertically-extending electrical interconnect for each vibrating element 506 to connect to the drive electrode of the vibrating element 506. If there is a common reference electrode for the transducer array 502, than at least one vertically extending electrical connection connect the ASIC layer in the base 516 to the reference electrode. There can be an array of vertically extending electrical connection for the reference electrode, although there can be fewer vertically extending electrical connection that for the drive electrodes. If there is a reference electrode for each vibrating element, then there would be a vertically extending electrical connection for each reference electrode, i.e., two vertically extending electrical connections for each vibrating element, one for the drive electrode and one for the reference electrode.

The vertically-extending electrical interconnects can be provided by the annular seals 514, or other conductive elements such as a vertically oriented electrical interconnect 232 (see FIG. 2A) that connects to a bond pad 520. Thus, each vibrating element 506 can be connected to an associated circuit in the ASIC by an associated vertically-extending interconnect. In this configuration, the leads from the vibrating elements do not require significant space on the surface of the transducer array. Consequently the vibrating elements 506 can be more closely packed compared to a system with leads that extend laterally, and the closer packing can improve image quality.

When the bottom surface of the transducer array 502 and the top surface of the base 516 are bonded (e.g., by a eutectic bonding process) at the metal annular seals 514, the electrical connections bumps plated on the bottom surface of the transducer array 502 can be bonded (e.g., by the eutectic bonding process) to the electrical connection bumps plated on the top surface of the base 516 to form the vertically-oriented electrical interconnects that electrically connect the individual drive electrodes in the transducer array 502 to their respective driving and/or sensing circuits in the ASIC layer in the base 516. In addition, in some implementations, the ground electrode can be a shared common ground electrode, and a single vertically-oriented interconnect can be made between the ground electrode and the electrical ground in the ASIC layer in the base 516. The single vertically-oriented interconnect for the reference electrode can also be formed using the eutectic bonding process, for example.

FIG. 5C shows an enlarged top view of the transducer array 502 that shows the flexible portions of the vibrating elements 506, the annular seals 514 supporting the flexible portions, and the electrical connection pads 520 to the driving electrodes. In some implementations, the drive electrodes are located at the bottom of the vibrating elements 506, and the electrical connections to the drive electrode can go directly from the electrical connection pads in the drive electrode layer vertically down to a corresponding connection pads in the top surface of the base 516. In some implementations, the drive electrodes are located at the top of the vibrating elements 506, and the electrical connections to the drive electrodes can go from the electrical connection pads in the drive electrode layer vertically down, through respective openings the piezoelectric layer and the reference electrode layer, to the electrical connection pads on the top surface of the base 516.

As set forth earlier in the specification, the sizes (e.g., radii) of the vibrating portions of the vibrating elements 506 and the spacing (or pitch) of the vibrating elements 506 in the transducer array 502 can be selected based on a desired imaging resolution of the ultrasonic transducer device 504. The smaller the size of the vibrating elements and the spacing/pitch between the vibrating elements, the better the resolution of the ultrasonic transducer is. In some implementations, the sizes (e.g., radii) of the flexible portions of the vibrating elements 506 can range between 20 microns to 70 microns. The size of the array of the transducer device can be selected based on the desired imaging area and the desired size of the transducer device 504. For example, for an intravascular application, the size of the array can be made smaller than 2 mm in at least two orthogonal directions.

In some implementations, the height of the curved vibrating element (e.g., the height of the dome-shaped or the dent-shaped piezoelectric element) in the transducer array can be chosen based on a desired operation range or resonance frequency and suitable impedance for matching to the impedance of an anticipated propagation medium. For example, for an ultrasonic transducer, the resonance frequency can range from 20 KHz to 30 MHz. For medical uses, the resonance frequencies typically range from 1 MHz to 15 MHz. The thickness of the piezoelectric element in the vibrating element 506 can range from 3 microns to 6 microns, for example. The height of the curved piezoelectric element can be 1.5 microns to 10 microns, for example. The resonance frequencies and impedance of the transducer array are highly tunable to suit the needs in various applications. In an example implementation, for a dome-shaped vibrating element having a radius of 50 microns and the dome angle of 25 degrees, the resonance frequency is approximately 14.3 MHz, and the electrical impedance is approximately 1.2 Kilo-Ohm at 15 MHz. The displacement is approximated 82 Angstrom per volt.

In some implementations, the driving voltages of a micro-dome/dent transducer array can be 5-10 volts to achieve comparable signal strength as that achievable using a conventional ultrasonic transducer driven at 100-200 volts or more. For example, an ultrasonic transducer device based on the micro-dome/dent array can have a driving efficiency of up to 3 MPa/V at a 15 MHz driving frequency. As a receiver, an ultrasonic transducer device based on a micro-dome array can have a sensitivity of up to 0.5 µV/Pa at a driving frequency of 15 MHz. In addition, the micro-dome/dent based transducer arrays can have up to 50% (6 dB) insertion loss as compared to a 20 dB loss in other conventional transducer technologies.

In some implementations, based on the semiconductor fabrication processes described in this specification, each vibrating element in the micro-dome/dent transducer array can be made very small compared to the wavelength of the ultrasonic waves that the transducer array can generate. In addition, the pitch between adjacent vibrating elements is not limited by the size of the dicing blade used in making vibrating elements from a bulk piezoelectric material. Because the transducer array can be made with small vibrating elements and have a pitch of less than half of the driving wavelength, each vibrating element can act as a point source for emitting waves with uniform circular wave fronts. Thus, the entire vibrating transducer array can be used to form a beam of a desired wave front direction, focus, and shape, without any unwanted side lobes. In addition, the omni-directional radiation pattern of the vibrating elements also makes a larger acceptance angle of the transducer device due to the radiation patterns of the vibrating elements located at the edges of the transducer array.

Although as set forth earlier, it is possible to have conductive traces leading to the individual vibrating elements in a transducer array within the same plane as the drive electrodes of the vibrating elements, such traces are possible when a small number of vibrating elements exists in the transducer array (e.g. 4×4 array) and the spacing between the vibrating elements is sufficiently large (e.g. 20-30 microns). When a high resolution, compact transducer device is desired, an integrated ASIC layer positioned directly below the transducer array can be implemented, where vertically-oriented electrical interconnects can be formed between the drive electrodes in the transducer array and the integrated ASIC layer. A high resolution, compact transducer device can have, for example, more than 200 vibrating elements, such as 1000 or more vibrating elements; a pitch of less than about 200 microns, such as between 100-200 microns, 65 microns or less, or 30 microns or less; and/or a resolution of about less than 0.25 mm, such as 0.1 mm or less, or 0.06 mm or less.

For example, when a large number (e.g., 1000) of vibrating elements is packed tightly within a small area (e.g., within a circle of 3 mm radius), there is not enough space to run individual traces from the drive electrodes within the same plane as the drive electrodes. Instead, vertically-oriented electrical connections can be made from a small electrical connection pad for each drive electrode to an integrated ASIC layer in the base below the transducer array. The integrated ASIC layer can have multiple layers of the circuitry made from NMOS transistors. The design of the ASIC layers can accommodate a large number of individual controlled outputs (e.g., 1000-2000) to be sent to respective drive electrodes in the transducer array, using only 100-200 external input connections. The same external input connections can also be used as output connections to send sensed voltage signals to an external imaging device.

Figure 6:
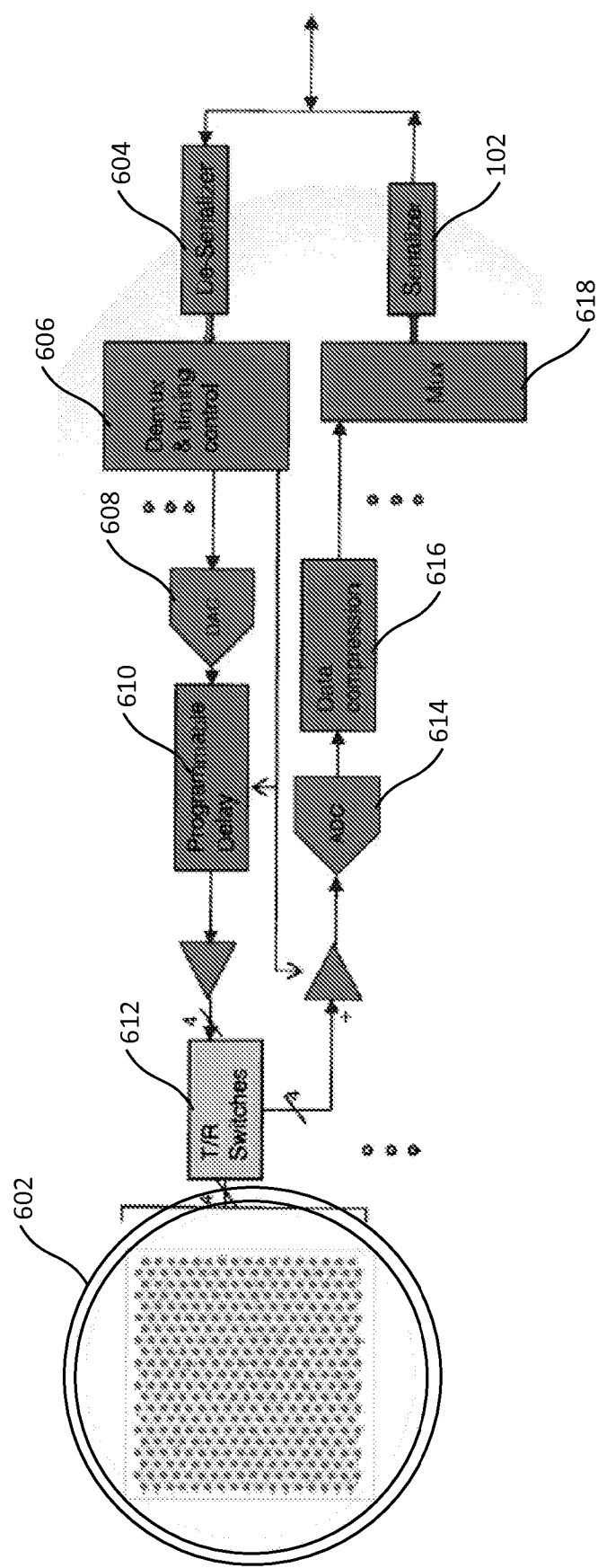
FIG. 6 is a schematic illustration of the circuitry functions that can be implemented in an integrated ASIC layer below the array of vibrating elements in a piezoelectric transducer device.

FIG. 6 shows example functions that can be implemented in an integrated ASIC layer in the base of transducer device 602 including a micro-dome/dent transducer array. The integrated ASIC layer can significantly reduce the number in external connections needed to use the transducer device. The fewer external connections lead to reduced overall size of the transducer device. In addition, much data processing can be performed on board within the ASIC layer of the transducer device, thus the external equipment needed to process the signals needed to drive the transducer array and analyze the signals received from the transducer array can also be reduced or simplified.

As show in FIG. 6, in some implementations, compounded control signals can be provided to the ASIC layer through the small number of external input connections of the ASIC layer. The compound control signals can be de-serialized by a de-serializer 604. The de-serialized control signals can be de-multiplexed by a de-multiplexer 606, and respective timing controls for the de-multiplexed signals can be added to the de-multiplexed signals. A digital to analog converter 608 can be implemented in the ASIC layer to convert the digital control signals to driving voltage signals for the individual vibrating elements in the transducer array. Respective time delays can be added to the individual drive voltage signal by a programmable time-delay controller 610 to create the desired beam shape, focus, and direction. A switch 612 can be implemented to switch the operation of the transducer array between the driving mode and the receiving mode. When the transducer device 602 is in a receiving mode, the received voltages signals can be converted to digital signals using an analog to digital converter 614. The digital signals are compressed by a data compression unit 616 and multiplexed by a multiplexer 618. The multiplexed signals can be serialized by a serializer 620 and sent back to external processing equipment through the external output connections (e.g., the same external connections used to receive input during the driving mode) of the ASIC layer. The above functions are merely illustrative for the functions that can be implemented using an integrated ASIC layer. More or fewer functions can be included in the ASIC layer in various implementations. In addition, exact implementations, the ASIC layer can be application dependent, and dependent on the size, shape, and layout of the transducer array.

The use of terminology such as "front," "back," "top," "bottom," "left," "right," "over," "above," and "below" throughout the specification and claims is for describing the relative positions of various components of the system(s) and relative positions of various parts of the various components described herein. Similarly, the use of any horizontal or vertical terms throughout the specification and claims is for describing the relative orientations of various components of the system(s) and the relative orientations of various parts of the various components described herein. Except where a relative orientation or position set forth below is explicitly stated in the description for a particular component, system, or device, the use of such terminology does not imply any particular positions or orientations of the system, device, component or part(s) thereof, relative to (1) the direction of the Earth's gravitational force, (2) the Earth ground surface or ground plane, (3) a direction that the system(s), device(s), or particular component(s) thereof may have in actual manufacturing, usage, or transportation; or (4) a surface that the system(s), device(s), or particular component(s) thereof may be disposed on during actual manufacturing, usage, or transportation.

A number of embodiments of the invention have been described. Nevertheless, it will be understood that various modifications may be made without departing from the spirit and scope of the inventions. For example, some processing steps may be carried out in a different order, modified, or omitted. The layout and configuration of the vibrating elements, electrodes, and electrical connections, may be varied.

What is claimed is:

1. A device for generating pressure waves in an external medium, comprising:
   a handle portion having a first distal end; and
   a transducer portion attached to the handle portion in proximity to the first distal end of the handle portion, the transducer portion comprising
      a support structure having a plurality of apertures; and
      a plurality of transducer elements, the plurality of transducer elements sharing a common reference electrode, each transducer element comprising a respective drive electrode and a respective piezoelectric element disposed between the respective drive electrode and the common reference electrode, wherein each transducer element has an outer surface positioned to receive or generate pressure waves in the external medium, and wherein the drive electrode, the common reference electrode, and the piezoelectric element of each transducer element each include a respective flexible portion and a respective stationary portion connected to the respective flexible portion,
   wherein the flexible portions of the drive electrode, reference electrode, and piezoelectric element of the plurality of transducer elements are suspended over the apertures in the support structure and are curved in a first direction relative to the apertures in the absence of an applied voltage between the drive electrode and the reference electrode and in the absence of an applied force that increases mechanical stress on the flexible portion, and wherein the flexible portions of the reference electrode, drive electrode, and piezoelectric element deflect in response to a driving voltage applied between the drive electrode and the reference electrode.

2. The device of claim 1, wherein the handle portion has a larger size in a length dimension than in a width dimension perpendicular to the length dimension.

3. The device of claim 2, wherein the plurality of vibrating elements are distributed in a first plane substantially perpendicular to the length dimension of the handle portion.

4. The device of claim 2, wherein the plurality of vibrating elements are distributed in a first plane substantially parallel to the length dimension of the handle portion.

5. The device of claim 2, wherein the plurality of vibrating elements are distributed in a plane substantially perpendicular to the length dimension of the handle portion, and within an annular area.

6. The device of claim 2, wherein the plurality of vibrating elements are distributed on a plurality of planes that are parallel to the length dimension of the handle portion and are at an equal distance to a common axis.

7. The device of claim 1, wherein the support structure comprises a base having a first surface and a plurality of cavities formed in the first surface of the base to provide the plurality of apertures.

8. The device of claim 1, wherein the support structure comprises a base and a plurality of supports between the base and the plurality of transducer elements, and wherein the plurality of apertures are formed through the plurality of supports, and wherein the base spans the plurality of apertures.

9. The device of claim 8, wherein the plurality of supports are conductive.

10. The device of claim 9, wherein the plurality of supports comprise metal rings.

11. The device of claim 10, wherein the metal rings provide eutectic bonds between the base and the plurality of transducer element.

12. The device of claim 9, wherein the plurality of supports electrically connect the plurality of transducer elements to integrated circuits formed in the base.

13. The device of claim 1, wherein the outer surface includes a flexible film covering the drive electrode or reference electrode.

14. The device of claim 1, wherein the plurality of transducer elements are substantially identical transducer elements.

15. The device of claim 14, wherein the plurality of transducer elements are formed in a continuous layer that spans the plurality of supports.

16. The device of claim 15, wherein the transducer-elements form a linear array of substantially identical transducer elements.

17. The device of claim 15, wherein the transducer elements form a two dimensional array of substantially identical transducer elements.

18. The device of claim 1, wherein the support structure includes integrated circuitry configured to independently sense pressure changes applied to the outer surface of the respective transducer elements of the plurality of transducer elements.

19. The device of claim 1, wherein the drive electrode is positioned closer to the support structure than the reference electrode.

20. The device of claim 1, wherein the flexible portions of the drive electrode, reference electrode, and piezoelectric element of each transducer element are each curved away from the apertures.

21. The device of claim 1, wherein the flexible portions of the drive electrode, reference electrode, and piezoelectric element of each transducer element are each curved toward the apertures.

22. The device of claim 1, wherein the piezoelectric element of each transducer element includes a curved portion surrounded by a planar portion, and wherein the planar portion and a peripheral portion of the curved portion of the piezoelectric element are part of the stationary portion of the piezoelectric element.

* * * * *